(12) United States Patent
Rathnam et al.

(10) Patent No.: US 7,070,341 B2
(45) Date of Patent: Jul. 4, 2006

(54) HIGH-DENSITY FIBER-OPTIC MODULE WITH MULTI-FOLD FLEXIBLE CIRCUIT

(75) Inventors: Lakshman Rathnam, Mountain View, CA (US); Edmond Lau, Sunnyvale, CA (US); Pierre Mertz, Sunnyvale, CA (US); Albert T. Yuen, Palo Alto, CA (US); Howard Huang, Santa Clara, CA (US)

(73) Assignee: Emcore Corporation, Somerset, NJ (US)

( * ) Notice: Subject to any disclaimer, the term of this patent is extended or adjusted under 35 U.S.C. 154(b) by 189 days.

(21) Appl. No.: 10/263,942

(22) Filed: Oct. 2, 2002

(65) Prior Publication Data

US 2004/0067030 A1    Apr. 8, 2004

(51) Int. Cl.
*G02B 6/36* (2006.01)
(52) U.S. Cl. .......................... 385/92; 385/53
(58) Field of Classification Search ............... 385/53, 385/56, 75, 92
See application file for complete search history.

(56) References Cited

U.S. PATENT DOCUMENTS

| | | | | |
|---|---|---|---|---|
| 4,806,802 A | * | 2/1989 | Okitaka et al. | 327/313 |
| 4,812,135 A | * | 3/1989 | Smith | 439/493 |
| 4,827,611 A | * | 5/1989 | Pai et al. | 29/843 |
| 5,337,202 A | * | 8/1994 | Jabbarai et al. | 360/97.01 |
| 5,596,665 A | * | 1/1997 | Kurashima et al. | 385/92 |
| 5,768,456 A | | 6/1998 | Knapp et al. | |
| 5,838,545 A | | 11/1998 | Clocher et al. | 361/719 |
| 5,893,726 A | * | 4/1999 | Farnworth et al. | 438/108 |
| 5,926,370 A | * | 7/1999 | Cromwell | 361/700 |
| 6,318,902 B1 | | 11/2001 | Igl et al. | 385/59 |
| 6,318,909 B1 | | 11/2001 | Giboney et al. | |
| 6,527,457 B1 | | 3/2003 | Chan et al. | 385/89 |
| 6,620,642 B1 | | 9/2003 | Dudoff et al. | 438/26 |
| 6,734,546 B1 | * | 5/2004 | Crane et al. | 257/692 |
| 6,767,142 B1 | * | 7/2004 | Stricot et al. | 385/92 |
| 6,835,003 B1 | * | 12/2004 | Giboney et al. | 385/90 |

* cited by examiner

*Primary Examiner*—Daniel Stcyr

(57) ABSTRACT

A flexible printed circuit board (FPCB) for fiber optic modules includes a board with multiple bends, forming a structure with sides and a bottom. The traces in the FPCB traverse from the opto-electronic chips, through the sides of the FPCB, to the module interconnects at the bottom. The multi-fold structure allows the FPCB to support a higher number of traces than conventional single-fold FPCB's, and it allows the fanning out of signal traces from the opto-electronic and electronic chips at the front of the fiber-optic module, thereby reducing the crosstalk between the traces. This higher number is provided with a FPCB that features a single insulating layer and without the need to criss-cross the traces, resulting in improved signal integrity over conventional multi-layer FPCB's.

37 Claims, 7 Drawing Sheets

HIGH-DENSITY FIBER-OPTIC MODULE WITH MULTI-FOLD FLEXIBLE CIRCUIT

FIELD OF THE INVENTION

The present invention relates to fiber optic modules with printed circuit boards, and more particularly to fiber optic modules with flexible printed circuit boards.

BACKGROUND OF THE INVENTION

The use of flexible printed circuit boards (FPCB) in fiber optic modules is known in the art. An FPCB is typically composed of a single layer of flexible insulating material, such as polyimide, with electrical traces typically made out of copper on at least one side of the insulating layer. The flexible layer serves both as an insulator and as a carrying medium for electrical traces. A FPCB may include more than one such insulating layer with electrical traces appearing between and at outer surfaces of any one of those layers. In order to route electrical signals to and from the embedded layers, the FPCB may contain electrically conductive passthrough holes, also known in the art as vias. The advantage of the FPCB over the rigid printed circuit board is that FPCB can be bent to fit into various compact electronic products. FIG. 1 illustrates a conventional fiber-optic module utilizing a FPCB with a single bend. The electrical traces on the FPCB 100 are used to bring electrical signals to and from the opto-electronic and electronic chips 102 and 104 to electrical interconnects 108 on the bottom of the fiber-optic module. The opto-electronic chips 102 include lasers or detectors, or both, while the electronic chips 104 include laser driver circuits or receiver circuits, or both. The electrical interconnect 108 couples the fiber-optic module to a large host printed circuit board (not shown). Alternatively, the interconnects 108 to the host printed circuit board may appear on the back 114 of the module. The host board will typically hold any number of fiber optic modules. A rigid piece of material 106 can be mounted to the FPCB 100 near the opto-electronic 102 and electronic chips 104, and another rigid piece of material 110 can be mounted to the FPCB 10 near the interconnects 108 to provide structural support. More electronic or opto-electronic processing circuitry 112 can also be provided on the rigid material 110.

There are three functional groups of fiber-optic modules: transmitters, receivers and transceivers. In transmitters, electrical signals carrying information enter via the interconnects 108, are amplified using the laser driver circuitry and are transmitted in the form of light signals using the laser chips. In receivers, optical signals carrying information are received by the photodiodes and amplified by the electronic circuitry to be delivered to the host board via interconnects 108. A fiber-optic transceiver performs the transmitting and receiver function in the same module (housing). The performance requirements on transceivers are more stringent than on transmitter and receiver modules because of the electrical crosstalk between the transmitter and the receiver chips and traces. Namely, in small dimensional environments, such as, fiber-optic modules, the large signal amplitudes required to drive lasers and the electrical transmission lines on the FPCB easily couple to the sensitive inputs of receivers, if they are physically close. Electromagnetic crosstalk is a difficult design problem in fiber-optic modules. Channel to channel crosstalk and transmitter to receiver crosstalk within the module can severely reduce the performance of the fiber-optic component.

The trace density traversing a bend in a conventional FPCB 100 is limited by the width of the traces, the thickness of the flexible circuit board and the number of layers. The mechanical and electrical characteristics of the traces and the FPCB have a strong influence on the high-speed electrical properties of the interconnect to the host board. A number of approaches have been explored in an attempt to maximize the density of traces in high-speed applications. In very high-speed systems, the transmission line impedance must be controlled (and constant) to prevent signal reflections that degrade the signal shape, while the information is typically carried with two signals of opposite polarity on two traces, also known as differential-signal traces. Typically, the impedance of high-speed signal traces is controlled by using at least one electrically conductive layer adjacent to the layer with the signal traces. There are additional constraints on differential-signal traces: The signal propagation delay on the two traces must be equal to prevent the introduction of jitter. Furthermore, in most applications, the traces carrying differential signals cannot be electrically coupled to each other, in which case additional ground traces have to be introduced between the two signal traces. All of these requirements result in designs with tightly controlled transmission-line impedances and propagation constants with added traces and layers for grounding. In order to reduce the size of such systems, the designer has few options: a reduction in trace width increases the trace resistance and inductance which alters the characteristic impedance of the lines that in turn can be corrected by decreasing the thickness of the insulating layer of the flexible circuit or increasing the dielectric permittivity of the flexible circuit material, or by employing a combination of both. Decreasing the trace width increases the trace losses, which in turn degrades the signal integrity. Adding high-speed signal layers doubly increases the thickness of the FPCB because each new high-speed signal layer requires a ground plane. This in turn increases the rigidity of the flexible printed board and the minimum bend ratio. FPCBs with more layers are hence more difficult to bend and fit into many of the present-day fiber-optic module form-factors. Adding more layers also increases the need for using vias. Maintaining the transmission line impedance and the propagation constant through a via is very difficult and not easily corrected. Increasing the density of the traces, furthermore, increases the possibility of trace-to-trace electrical crosstalk. Therefore, the conditions on performance and the mechanical rigidity of the FPCB collectively place a limit on the number of traces that can traverse a bend.

Accordingly, there exists a need for an improved fiber optic module design utilizing a flexible printed circuit board. The improved FPCB should provide interconnects between the optoelectronic and electronic chips and the module interconnects without the use of multiple trace layers and should also provide total trace counts that exceed the conventional single-layer flexible printed-circuit board fiber-optic module design while still delivering the required trace transmission performance necessary for high-speed performance of the fiber-optic module. The present invention addresses such a need.

SUMMARY OF THE INVENTION

A flexible printed circuit board (FPCB) for fiber optic modules includes a board with multiple bends, forming a structure with sides and a bottom. The traces in the FPCB traverse from the opto-electronic chips, through the sides of the FPCB, to the module interconnects at the bottom. The multi-fold structure allows the FPCB to support a higher number of traces than conventional single-fold FPCB's, and it allows the fanning out of signal traces from the optoelectronic and electronic chips at the front of the fiber-optic module, thereby reducing the crosstalk between the traces. This higher number is provided with a FPCB that features a single insulating layer and without the need to criss-cross the traces, resulting in improved signal integrity over conventional multi-layer FPCB's.

DETAILED DESCRIPTION

The present invention provides an improved flexible printed circuit board for fiber optic modules. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

In accordance with the present invention, the fiber-optic module contains a flexible printed circuit board (FPCB) that comprises multiple bends, forming a structure with sides and a bottom. The traces in the FPCB traverse from the opto-electronics, through the sides of the FPCB, and to the interconnects at the bottom. The multi-fold structure allows the FPCB to support a higher-number of traces than single conventional fold FPCB's. This higher number is provided with a FPCB that only has one insulating layer, traces on at least one side of that insulating layer, and without the need to criss-cross the traces, resulting in reduced crosstalk and improved signal integrity. The use of multiple layers will further increase this number.

The reduced crosstalk is particularly significant for transceiver modules. The FPCB in accordance with the present invention allows the transmitting traces to traverse one side of the FPCB and the receiving traces to traverse the other side of the FPCB. The physical separation between the transmitting and receiving traces are thus greater than with conventional single fold FPCB's, in turn reducing the transmitter to receiver crosstalk.

To more particularly describe the features of the present invention, please refer to FIGS. 2 through 5 in conjunction with the discussion below.

Figure 1:
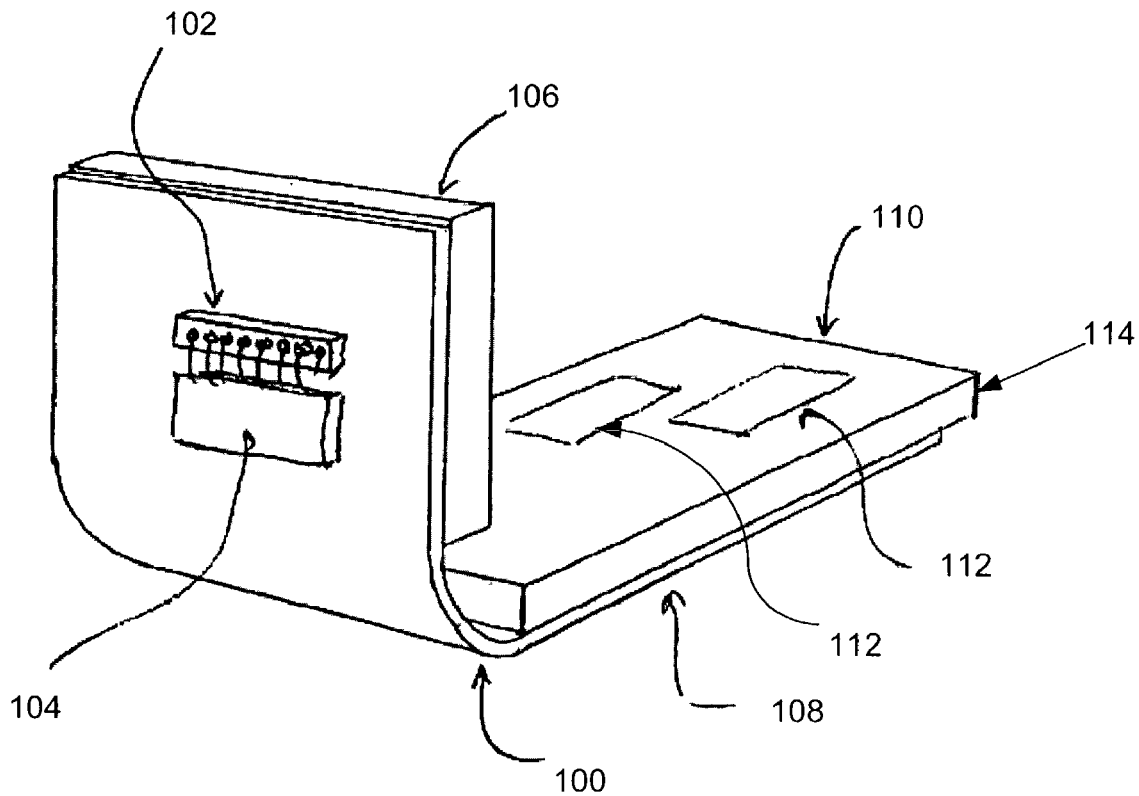
FIG. 1 illustrates a conventional flexible printed circuit board (FPCB) with a single bend.
Figure 2:
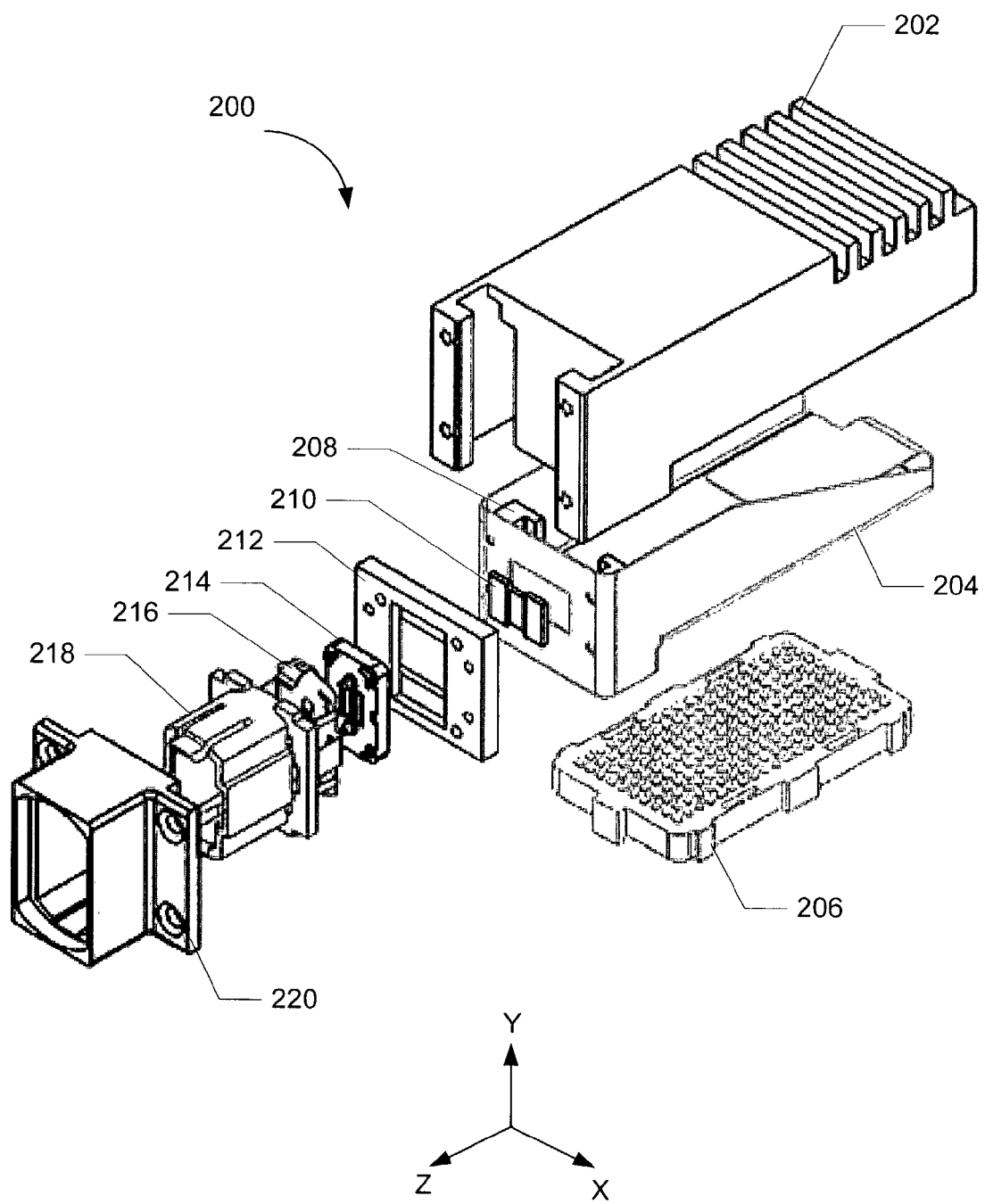
FIG. 2 is an exploded view of an embodiment of a fiber optic module utilizing the preferred embodiment of the FPCB in accordance with the present invention.

FIG. 2 is an exploded view of an embodiment of a fiber optic module utilizing the preferred embodiment of the FPCB in accordance with the present invention. The fiber optic module 200 comprises an outer housing 202, the FPCB 204, and a slug 208 to which the FPCB 204 is coupled. The optoelectronic and electronic chips 210 are coupled to the slug 208 through the opening in the FPCB 204. The opening 304 is depicted more clearly in FIG. 3A. The slug 208 is then coupled to the outer housing 202, as described further below. The module 200 further comprises a connector 206 that couples to the interconnects of the FPCB 204 and optoelectronic and electronic chips 210 that are electrically connected to the FPCB 204. The module 200 further comprises a spacer 212 that couples to the FPCB 204, an optic plate 214 with lenses that couples to the spacer 212, and an electromagnetic radiation shield 216 that resides on a face of the optic plate 214. The module 200 further comprises an adapter 218 that couples to the spacer 212 such that the optic plate 214 and the shield 216 reside within the adapter 218. A snout 220 couples to the outer housing 202.

Figure 3A:
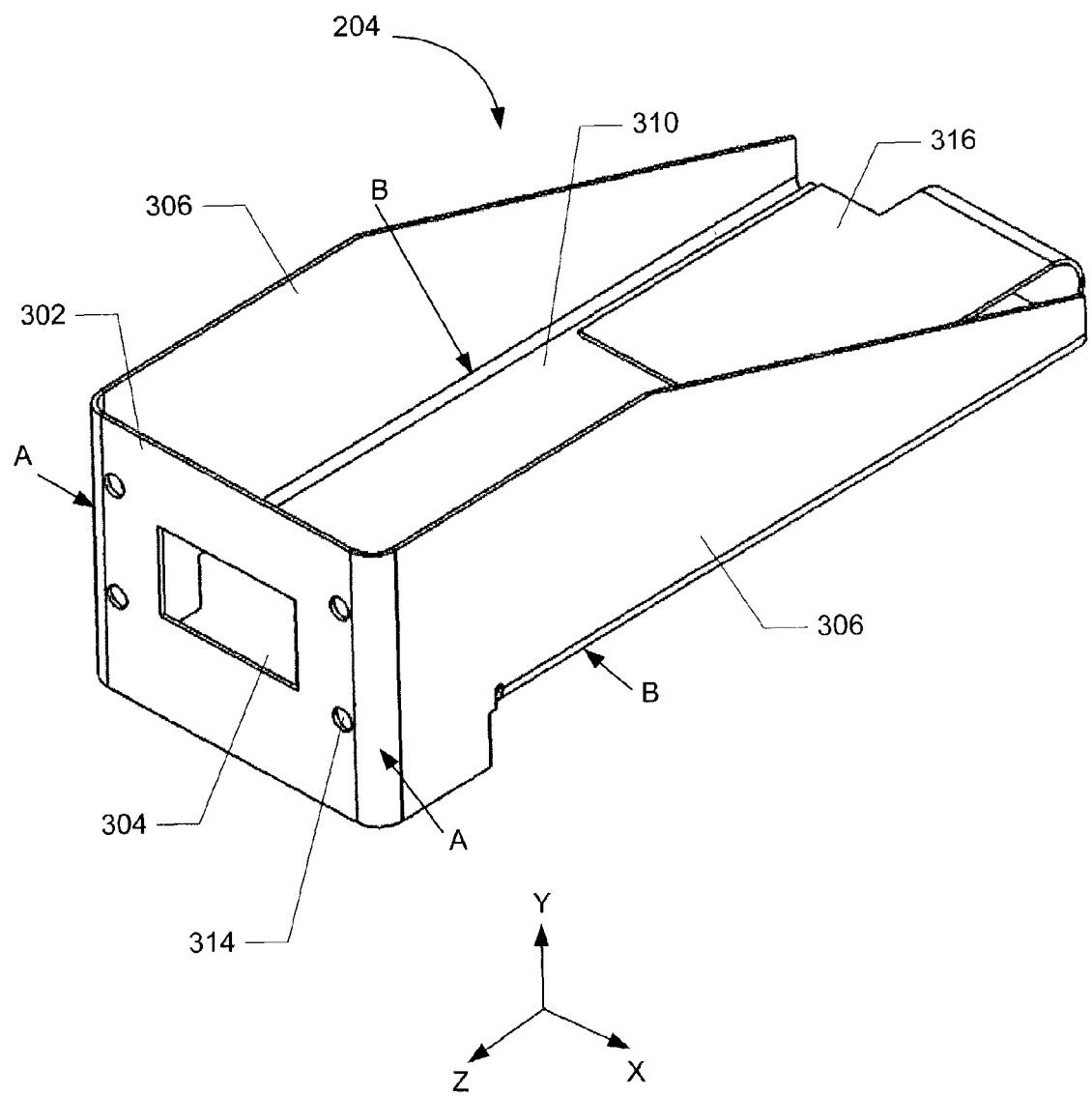
FIGS. 3A and 3B illustrate in more detail the preferred embodiment of the FPCB 204 in accordance with the present invention.
Figure 3B:
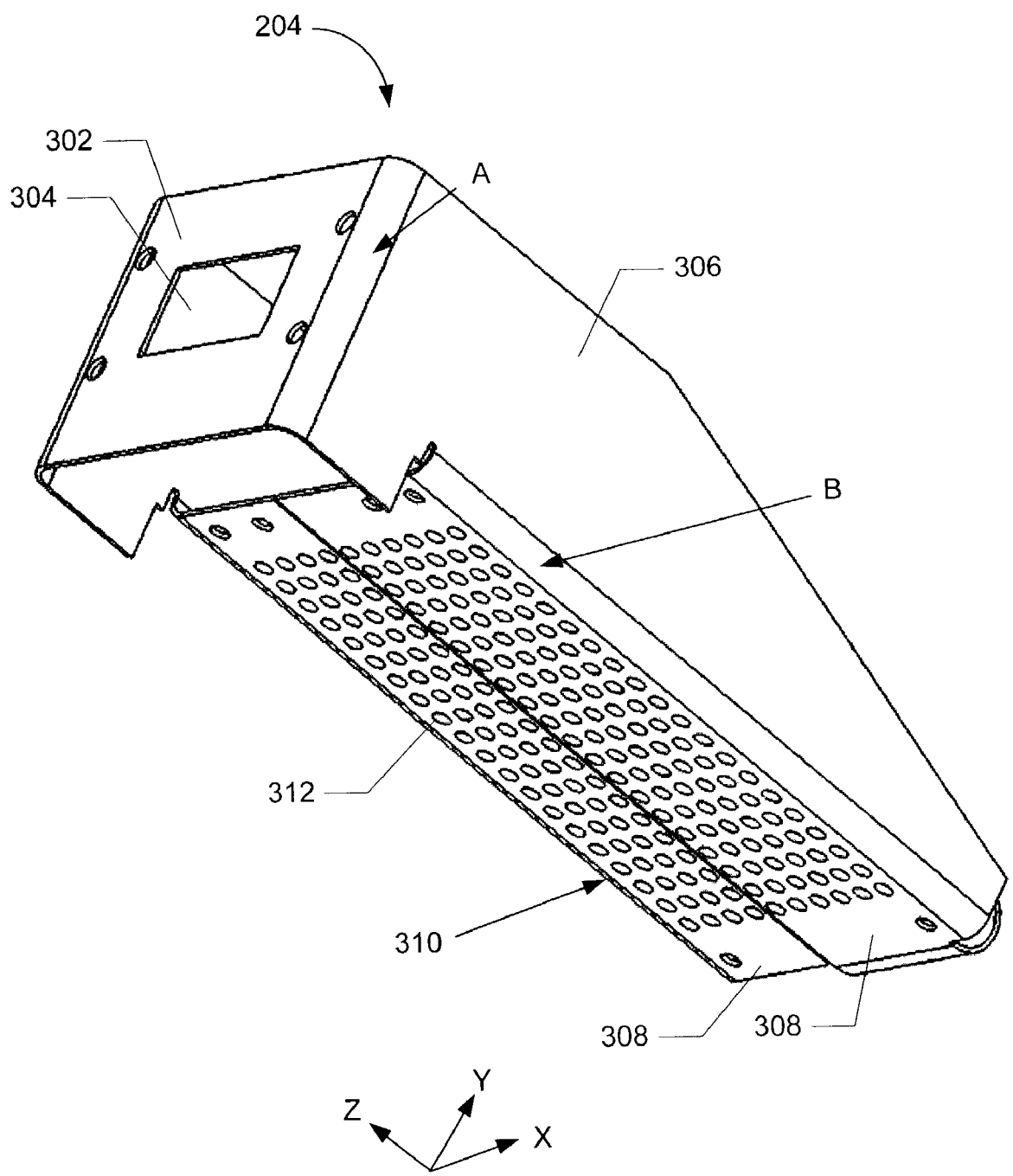

FIGS. 3A and 3B illustrate in more detail the preferred embodiment of the FPCB 204 in accordance with the present invention. The FPCB 204 comprises a front face 302 with an opening 304 for the opto-electronic and electronic chips 210 and holes 314 for coupling with the spacer 212 (FIG. 2). The FPCB 204 is first folded at locations A and then folded at locations B, forming sides 306 and a bottom 310 of the FPCB 204. The bottom 310 comprises two sections 308. On the two sections 308 reside the interconnects 312, which couples to the connector 216. Optionally, the FPCB 204 can fold back upon itself at an end 316 to support a programmable integrated circuit (not shown) that otherwise would not fit onto the bottom 310 of the FPCB 204. In the preferred embodiment, the flexible printed circuit board has a single layer of traces which traverses from the front face 302 to the bottom face 310 through the side faces 306.

Figure 3C:
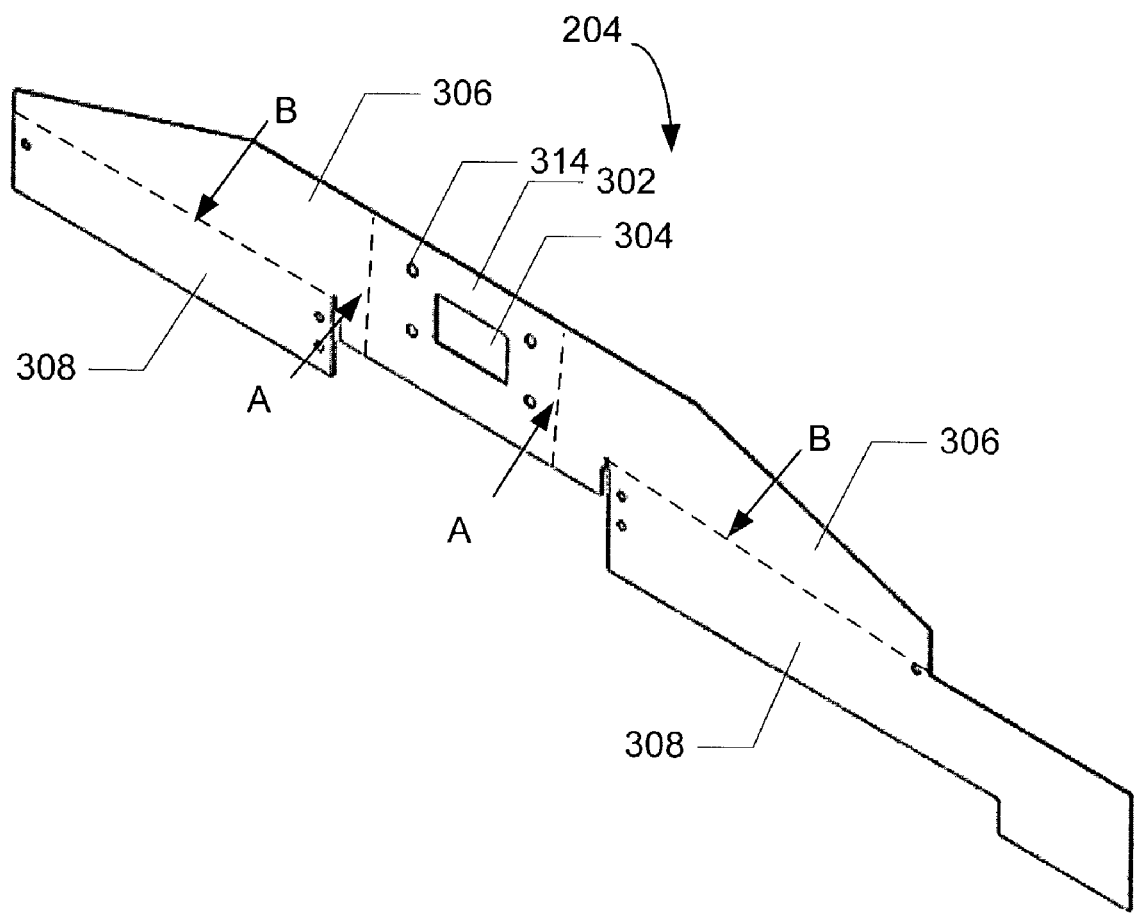
FIG. 3C illustrates an unfolded FPCB.

FIG. 3C illustrates an unfolded FPCB 204. The proximate locations A and B of the folds are marked with dotted lines. The folding at locations A defines the front face 302. The folding at locations B defines the sides 306. The two sections 308 together form the bottom 310 of the FPCB 204.

Because the FPCB 204 folds to form the sides 306 and then folds again to form the bottom 310, traces can traverse from the opto-electronic and electronic chips 210 in the opening 304 to the sides 306, and then to the interconnects 312 on the bottom 310 without the need to criss-cross with each other. Because the bottom 310 of the FPCB 204 is formed from the two sections 308, a single layer of the FPCB 204 can provide twice the number of traces than a single layer of a conventional single-fold FPCB. Without needing striplines or vias for multi-layers of traces, and without needing to criss-cross the traces, the signals carried by the traces of the FPCB 204 has improved integrity over those in conventional single-fold FPCB's. In addition, the FPCB 204 is more flexible.

The FPCB 204 provides a particular improvement in signal quality for transceiver modules. Because the FPCB 204 folds to form two sides 306, transmitting traces can traverse one side of the FPCB 204 while the receiving traces can traverse the other side of the FPCB 204. This increases the physical separation between the transmitting and receiving traces, in turn reducing the transmitter to receiver crosstalk.

Figure 4:
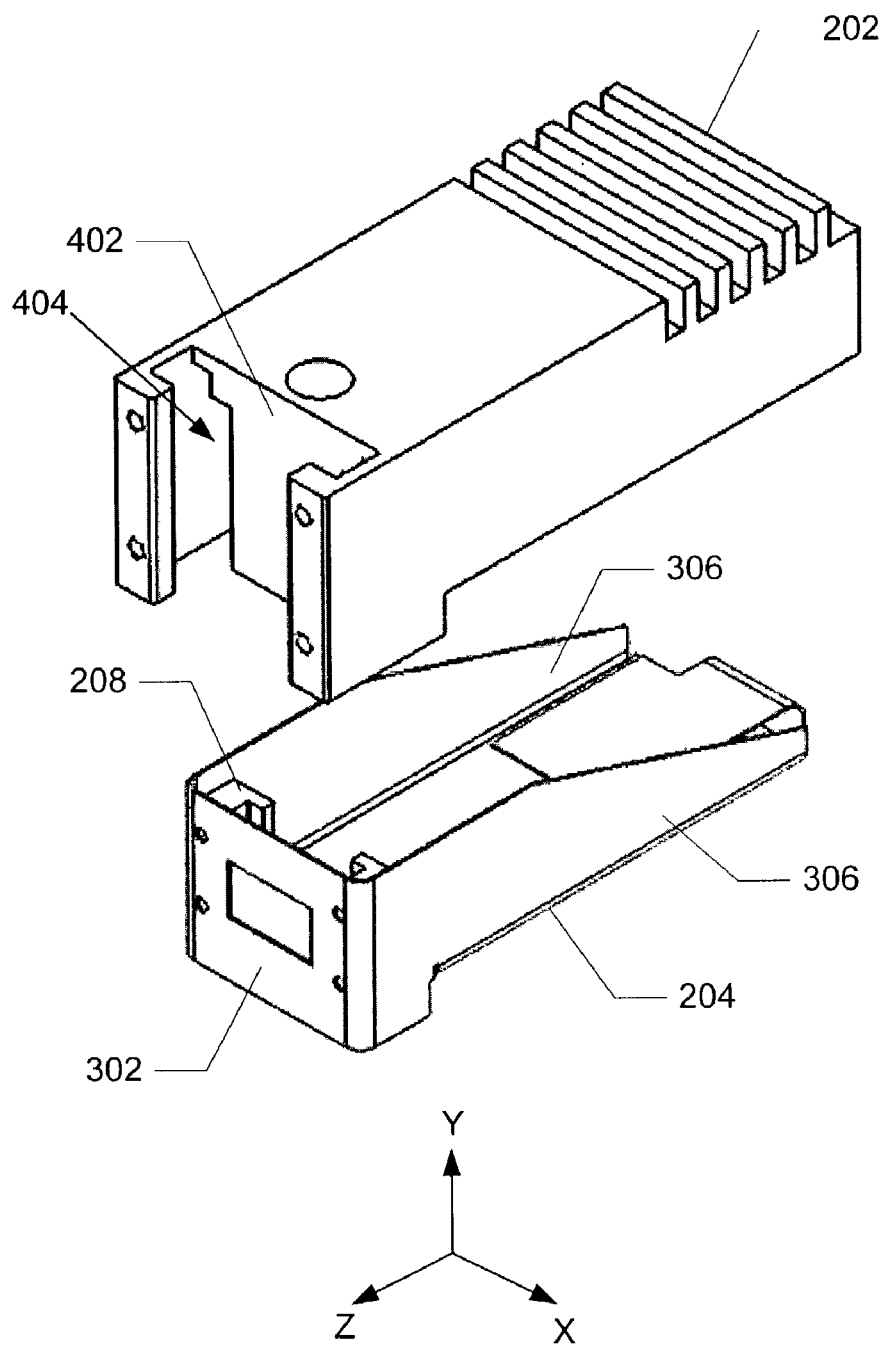
FIG. 4 illustrates in more detail the FPCB, the slugs, and the outer housing.
Figure 5:
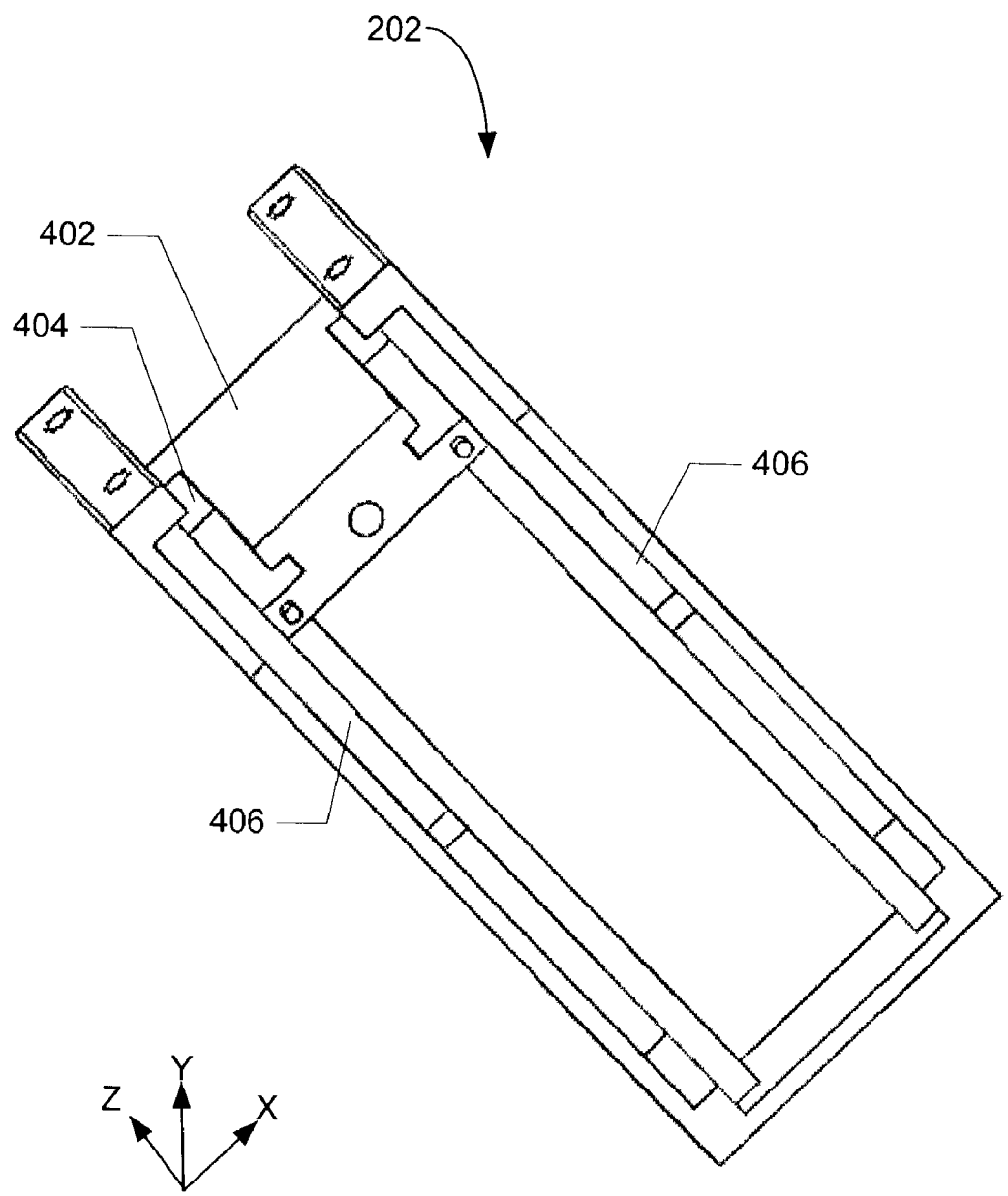
FIG. 5 illustrates the slots in the outer housing.

FIG. 4 illustrates in more detail the FPCB 204, the slug 208, and the outer housing 202. The front face 302 of the FPCB 204 couples to the slug 208. The slug 208 with the FPCB 204 couples to a flat face 402 of the outer housing 202. In the preferred embodiment, the couplings are accomplished with use of epoxy. Other coupling methods are possible. Openings 404 that match the shape of the slug 208 help to guide the slug 208, and thus the FPCB 204, to its proper location within the outer housing 202. When coupled in this manner, the sides 306 of the FPCB 204 reside within slots 406 in the walls of the outer housing 202, as illustrated in FIG. 5. The slots 406 provide the sides 306 of the FPCB 204 with structural support. With this structural support, the fiber optic module 200 or the outer housing 202 can be handled without damaging the FPCB 204. The outer housing 202 also functions as a heat sink, with heat being transferred from the optoelectronic and electronic chips 210 to the slug 308, and then to the outer housing 202.

Optionally, a thermally conductive but electrically insulating layer (not shown) can be placed over the surface 402 of the outer housing 202 and proximate to the slug 208. This dielectric layer may be used to improve high-frequency performance and grounding of the opto-electronic and electronic chips 210 while maintaining the heat sink capabilities.

Although the preferred embodiment of the FPCB is described with the fiber optic modules illustrated in FIG. 2, one of ordinary skill in the art will understand that the FPCB may be used with other fiber optic modules without departing from the spirit and scope of present invention.

An improved flexible printed circuit board for fiber optic modules has been disclosed. The FPCB comprises a board with multiple bends, forming a structure with sides and a bottom. The traces in the FPCB traverse from the opto-electronics, through the sides of the FPCB, to the interconnects at the bottom. The multi-fold structure allows the FPCB to support a higher-number of traces than single conventional fold FPCB's. This higher number is provided with a single layer of traces and without the need to criss-cross the traces, resulting in improved signal integrity over conventional multi-layer FPCB's.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A flexible printed circuit board, comprising:
a plurality of conductive traces;
a first set of bends in the flexible printed circuit board, the first set of bends defining a front face; and
a second set of bends in the flexible printed circuit board, the second set of bends defining a plurality of side faces and a bottom face, wherein the plurality of traces traverses from the front face through the side faces to the bottom face, wherein the front face is formed from a central portion of the flexible printed circuit board and the bottom face is formed from opposing, distal end portions of the flexible printed circuit board.

2. The board of claim 1, wherein the front face is configured for coupling of light with opto-electronic chips.

3. The board of claim 1, wherein the bottom face comprises a plurality of interconnects.

4. The board of claim 1, wherein the plurality of conductive traces resides on a single layer of the board.

5. The board of claim 1, wherein a plurality of transmitting traces traverse a first side face and a plurality of receiving traces traverse a second side face.

6. A fiber optic module, comprising:
flexible printed circuit board, comprising:
plurality of conductive traces,
first set of bends in the board, the first set of bends defining a front face, and
second set of bends in the board, the second set of bends defining a plurality of side faces and a bottom face, wherein the plurality of traces traverses from the front face through the side faces to the bottom face, wherein the front face is formed from a central portion of the flexible printed circuit board and the bottom face is formed from opposing, distal end portions of the flexible printed circuit board.

7. The module of claim 6, further comprising opto-electronic chips electrically coupled to the front face of the flexible printed circuit board.

8. The module of claim 7, further comprising: a slug coupled to the front face of the flexible printed circuit board; and an outer housing coupled to the slug.

9. The module of claim 8, wherein the outer housing functions as a heat sink, wherein heat from the opto-electronic chips transfers to the outer housing through the slug.

10. The module of claim 8, wherein the outer housing comprises slots, wherein the side faces of the flexible printed circuit board resides within the slots.

11. The module of claim 8, wherein the outer housing comprises guides for guiding the slug and the flexible printed circuit board to a desired position.

12. The module of claim 8, wherein the outer housing comprises a face, wherein the slug is coupled to the face of the outer housing.

13. The module of claim 8, further comprising a dielectric layer residing between an opto-electronic chip and the outer housing.

14. The module of claim 13, wherein the dielectric layer is thermally conductive and electrically insulating.

15. The module of claim 6, wherein the bottom face of the flexible printed circuit board comprises a plurality of interconnects.

16. The module of claim 6, wherein the flexible printed circuit board consists of one insulating layer, wherein the plurality of conductive traces is provided on at least one side of the insulating layer.

17. The module of claim 6, wherein a plurality of transmitting traces traverse a first side face of the flexible printed circuit board and a plurality of receiving traces traverse a second side face of the flexible printed circuit board.

18. An optical transceiver module, comprising:
a flexible printed circuit board, comprising:
a plurality of transmitting traces,
a plurality of receiving traces,
a first set of bends in the board, the first set of bends defining a front face, and
second set of bends in the board, the second set of bends defining a first side face, a second side face, and a bottom face, wherein the plurality of transmitting traces traverse from the bottom face through the first side face to the front face, wherein the plurality of receiving traces traverse from the front face through the second side face to the bottom face, wherein the front face is formed from a central portion of the flexible printed circuit board and the bottom face is formed from opposing, distal end portions of the flexible printed circuit board.

19. A method for providing a flexible printed circuit board, comprising the steps of:
(a) providing a plurality of conductive traces in the flexible printed circuit board;
(b) bending the board to define a front face; and
(c) bending the board again to define a plurality of side faces and a bottom face, wherein the plurality of traces traverses from the front face through the side faces to the bottom face, wherein the front face is formed from a central portion of the flexible printed circuit board and the bottom face is formed from opposing, distal end portions of the flexible printed circuit board.

20. The method of claim 19, wherein the front face is configured for coupling with opto-electronic chips.

21. The method of claim 19, wherein the bottom face comprises a plurality of interconnects.

22. The method of claim 19, wherein the flexible printed circuit board consists of one insulating layer, wherein the plurality of conductive traces is provided on at least one side of the insulating layer.

23. The method of claim 19, wherein the providing step (a) comprises:
(a1) providing a plurality of transmitting traces and a plurality of receiving traces.

24. The method of claim 23, wherein the bending step (c) comprises:
(c1) bending the board again to define a first side face, a second side face, and a bottom face, wherein the plurality of transmitting traces traverse from the bottom face through the first side face to the front face, wherein the plurality of receiving traces traverse from the front face through the second side face to the bottom face.

25. The method of claim 19, further comprising: (d) inserting the plurality of side faces into a plurality of slots in an outer housing.

26. A flexible printed circuit board for a fiber optic module having an opto-electronic chip and an electrical connector, said flexible printed circuit board comprising:
a substantially continuous flexible substrate having a central portion and a plurality of branches, said plurality of branches separately extending from the central portion and where the central portion supports the opto-electronic chip, at least one branch of the plurality of branches having a plurality of conductive traces disposed on a first side of the at least one branch and where at least some traces of the plurality of traces are connected on a first end to the opto-electronic chip with a distal end of each branch of the plurality of branches being juxtaposed for connection of the at least some conductive traces on a second end to the electrical connector, at least one branch of the plurality of branches having a plurality of bends at a plurality of respective predetermined locations to provide a spatial separation among the plurality of branches that reduces crosstalk among signals transmitted through the traces without a need to criss-cross the traces.

27. The flexible printed circuit board as in claim 26 wherein the plurality of bends further comprises a first set of bends in the plurality of branches, the first set of bends defining a front face.

28. The flexible printed circuit board as in claim 27 wherein the plurality of bends further comprises a second set of bends, the second set of bends defining a plurality of side faces and a bottom face.

29. The flexible printed circuit board as in claim 28 further comprising a plurality of traces in each of the plurality of branches.

30. The flexible printed circuit board as in claim 29 further comprising the plurality of traces traversing a path from the front face to the bottom face.

31. The flexible printed circuit board as in claim 30 wherein the plurality of traces further comprises a first set of transmitting traces and a second set of receiving traces and wherein the first set of traces traverse a first side face and the second set of traces traverse a second side face.

32. A fiber optic module comprising:

an opto-electronic chip;

an electrical connector; and a substantially continuous flexible substrate having a central portion and a plurality of branches, said plurality of branches separately extending from the central portion and where the central portion supports the opto-electronic chip, at least one branch of the plurality of branches having a plurality of conductive traces disposed on a first side of the at least one branch and where at least some traces of the plurality of traces are connected on a first end to the opto-electronic chip with a distal end of each branch of the plurality of branches being juxtaposed for connection of the at least some conductive traces on a second end to the electrical connector, at least one branch of the plurality of branches having a plurality of bends at a plurality of respective predetermined locations to provide a spatial separation among the plurality of branches that reduces crosstalk among signals transmitted through the traces without a need to criss-cross the traces.

33. The flexible printed circuit board as in claim 32 wherein the plurality of bends further comprises a first set of bends in the plurality of branches, the first set of bends defining a front face.

34. The flexible printed circuit board as in claim 33 wherein the plurality of bends further comprises a second set of bends, the second set of bends defining a plurality of side faces and a bottom face.

35. The flexible printed circuit board as in claim 34 further comprising a plurality of traces in each of the plurality of branches.

36. The flexible printed circuit board as in claim 35 further comprising the plurality of traces traversing a path from the front face to the bottom face.

37. The flexible printed circuit board as in claim 36 wherein the plurality of traces further comprises a first set of transmitting traces and a second set of receiving traces and wherein the first set of traces traverse a first side face and the second set of traces traverse a second side face.

* * * * *